United States Patent
Obiya et al.

(10) Patent No.: US 9,787,334 B2
(45) Date of Patent: Oct. 10, 2017

(54) HIGH FREQUENCY POWER AMPLIFIER, HIGH FREQUENCY FRONT-END CIRCUIT, AND RADIO COMMUNICATION DEVICE

(71) Applicant: Murata Manufacturing Co., Ltd., Kyoto (JP)

(72) Inventors: Hidenori Obiya, Kyoto (JP); Hisao Hayafuji, Kyoto (JP); Takaya Wada, Kyoto (JP); Shinya Hitomi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/081,474

(22) Filed: Mar. 25, 2016

(65) Prior Publication Data
US 2016/0211871 A1 Jul. 21, 2016

Related U.S. Application Data

(63) Continuation of application No. PCT/JP2014/067329, filed on Jun. 30, 2014.

(30) Foreign Application Priority Data

Sep. 26, 2013 (JP) ................................. 2013-199163

(51) Int. Cl.
  *H04L 27/00* (2006.01)
  *H04B 1/04* (2006.01)
  (Continued)

(52) U.S. Cl.
  CPC ........... *H04B 1/0475* (2013.01); *H03F 3/195* (2013.01); *H03F 3/211* (2013.01); *H03F 3/245* (2013.01);
  (Continued)

(58) Field of Classification Search
  CPC ... H04L 1/0003; H04L 1/0071; H04L 5/0007; H04L 1/0009; H04L 27/0008;
  (Continued)

(56) References Cited

U.S. PATENT DOCUMENTS

| 5,796,772 A | 8/1998 | Smith |
| 6,144,260 A | 11/2000 | Hashimoto |

(Continued)

FOREIGN PATENT DOCUMENTS

| CN | 202906899 U | 4/2013 |
| JP | H08-335831 A | 12/1996 |

(Continued)

OTHER PUBLICATIONS

International Search Report issued in Application No. PCT/JP2014/067329 dated Jul. 29, 2014.

(Continued)

*Primary Examiner* — Zewdu Kassa
(74) *Attorney, Agent, or Firm* — Pearne & Gordon LLP

(57) ABSTRACT

A high frequency power amplifier includes a first high frequency amplifier, a final high frequency amplifier, and a tunable filter. The tunable filter is connected between the first high frequency amplifier and the final high frequency amplifier. The first high frequency amplifier and the final high frequency amplifier are each a multimode/multiband power amplifier. The tunable filter is regulated such that its pass band includes the frequency band of a transmission signal and its attenuation band includes the frequency band of a reception signal in a communication band used in transmission and reception. The pass band and the attenuation band are switched by the tunable filter in accordance with the communication band used in transmission and reception.

13 Claims, 5 Drawing Sheets

(51) Int. Cl.
  *H03F 3/24* (2006.01)
  *H03F 3/195* (2006.01)
  *H03F 3/21* (2006.01)
  *H04B 1/525* (2015.01)

(52) U.S. Cl.
  CPC ........ *H04B 1/525* (2013.01); *H03F 2200/111* (2013.01); *H03F 2200/165* (2013.01); *H03F 2200/168* (2013.01); *H03F 2200/171* (2013.01); *H03F 2200/294* (2013.01); *H03F 2200/408* (2013.01); *H03F 2200/411* (2013.01); *H03F 2200/451* (2013.01); *H03F 2203/21157* (2013.01)

(58) Field of Classification Search
  CPC ............... H04L 27/2601; H04L 1/0025; H04L 27/2647; H04L 1/20; H04B 1/40; H04B 3/23; H04B 1/403; H04B 1/30; H04B 1/28; H04N 5/4401
  USPC ......................................... 375/295, 219, 316
  See application file for complete search history.

(56) References Cited

U.S. PATENT DOCUMENTS

| | | | |
|---|---|---|---|
| 6,489,862 | B1 | 12/2002 | Frank |
| 7,444,124 | B1* | 10/2008 | Loeb ................. H03F 1/0261 330/124 R |
| 2003/0067368 | A1 | 4/2003 | Ohara |
| 2005/0127156 | A1* | 6/2005 | Yoo ................. H04B 1/3805 235/375 |
| 2010/0197249 | A1 | 8/2010 | Rajkotia |
| 2010/0197257 | A1 | 8/2010 | Rajkotia |
| 2013/0109334 | A1 | 5/2013 | Kwon et al. |
| 2013/0244591 | A1* | 9/2013 | Weissman ............. H03H 9/462 455/77 |

FOREIGN PATENT DOCUMENTS

| | | |
|---|---|---|
| JP | 2000-115016 A | 4/2000 |
| JP | 2002-185262 A | 6/2002 |
| JP | 2004-007352 A | 1/2004 |
| JP | 2004-194097 A | 7/2004 |
| JP | 2008-193721 A | 8/2008 |
| JP | 2011-182271 A | 9/2011 |
| JP | 2012-517200 A | 7/2012 |
| JP | 2012-517201 A | 7/2012 |
| JP | 2013-110619 A | 6/2013 |

OTHER PUBLICATIONS

Written Opinion issued in Application No. PCT/JP2014/067329 dated Jul. 29, 2014.

* cited by examiner

HIGH FREQUENCY POWER AMPLIFIER, HIGH FREQUENCY FRONT-END CIRCUIT, AND RADIO COMMUNICATION DEVICE

BACKGROUND

Technical Field

The present disclosure relates to a high frequency power amplifier for amplifying a high frequency signal, a high frequency front-end circuit including the high frequency power amplifier, and a radio communication device using the amplified high frequency signal as a transmission signal.

In accordance with diversification of communication bands, various types of high frequency front-end circuits and radio communication devices using a multimode/multiband power amplifier for amplifying transmission signals of a plurality of bands have been proposed as described in, for example, Patent Document 1. The multimode/multiband power amplifier is designed such that a desired gain is obtained in each of the plurality of frequency bands, and the desired gains are thereby obtained in a wide band (wide frequency band).

The high frequency front-end circuits and the radio communication devices each include a receiver side circuit that includes a low noise amplifier (LNA) or the like to amplify a reception signal.

Patent Document 1: Japanese Unexamined Patent Application Publication No. 2011-182271

BRIEF SUMMARY

The high frequency front-end circuits have the problem of wraparound of the transmission signal to the receiver side circuit. More specifically, the transmission signal outputted from the power amplifier sometimes wraps around the receiver side circuit, thus deteriorating a signal to noise ratio of the reception signal.

Especially when the predetermined frequency band of the transmission signal and the predetermined frequency band of the reception signal constituting a communication band are close to each other, due to an increase in the number of the communication bands, a component of the transmission signal at the predetermined frequency of the reception signal (a reception frequency component of the transmission signal) tends to wrap around the receiver side circuit.

Also, in the multimode/multiband power amplifier, although a high gain is obtained in the wide band, a gain of a certain degree is undesirably obtained in a frequency band other than the desired band.

Thus, the reception frequency component of the transmission signal is amplified by the power amplifier and wraps around the receiver side circuit, thus further deteriorating the signal to noise ratio of the reception signal.

The present disclosure provides a multimode/multiband-corresponding high frequency power amplifier that can regulate the output level of a reception frequency component of a transmission signal, and a high frequency front-end circuit and a radio communication device that each include the high frequency power amplifier.

A high frequency power amplifier according to the present disclosure includes a first high frequency amplifier having a gain in a wide band; a final high frequency amplifier connected subsequent to the first high frequency amplifier, the final high frequency amplifier having a gain in a wide band; and a tunable filter. The tunable filter is connected between the first high frequency amplifier and the final high frequency amplifier. The tunable filter provides a predetermined attenuation in a specific frequency band other than a frequency band to be amplified.

According to this configuration, even with the use of the wide band high frequency amplifiers, the tunable filter suppresses the output of a specific frequency component in the unnecessary frequency band.

Also, in the high frequency power amplifier according to the present disclosure, the frequency band to be amplified may be a transmission modulation band selected within a transmission frequency band of a predetermined communication band.

According to this configuration, even if a part of the transmission frequency band is used for transmission, the above-described effect can be obtained. Also, narrowing the pass band width of the tunable filter allows improved bandpass characteristics.

The high frequency power amplifier according to the present disclosure can have the following configuration. There is provided at least one of an isolator connected between the first high frequency amplifier and the tunable filter, and an isolator connected between the tunable filter and the final high frequency amplifier.

The high frequency power amplifier according to the present disclosure further can have the following configuration. The high frequency power amplifier includes a first isolator connected between the first high frequency amplifier and the tunable filter. The high frequency power amplifier includes a second isolator connected between the tunable filter and the final high frequency amplifier.

This configuration serves to prevent the occurrence of a loss caused by the impedance mismatching between the first high frequency amplifier and the final high frequency amplifier owing to the insertion of the tunable filter.

The high frequency power amplifier according to the present disclosure may have the following configuration. The first high frequency amplifier includes a plurality of unit amplifiers. The tunable filter is connected between the final high frequency amplifier and the unit amplifier connected to an input terminal of the final high frequency amplifier.

This configuration serves to prevent the output of the specific frequency component in the unnecessary frequency band, even if the first high frequency amplifier includes the two or more unit amplifiers and the final high frequency amplifier is provided, that is to say, there are three or more amplifiers.

A high frequency front-end circuit according to the present disclosure is characterized in the following configuration. The high frequency front-end circuit includes the high frequency power amplifier in any of the described above; a branching filter for outputting a high frequency signal inputted from a first individual terminal to a common terminal, and outputting a high frequency signal inputted from the common terminal to a second individual terminal, the high frequency power amplifier being connected to the first individual terminal; and a high frequency amplification circuit connected to the second individual terminal, for amplifying the high frequency signal from the branching filter. In the high frequency front-end circuit, the frequency band to be amplified includes a frequency band of a transmission signal to be amplified by the high frequency power amplifier. The specific frequency band includes a frequency band of a reception signal to be amplified by the high frequency amplification circuit for amplifying the high frequency signal from the branching filter.

This configuration serves to reduce the level of a component of the transmission signal outputted from the high frequency power amplifier at the frequency of the reception signal. Therefore, the component of the transmission signal at the frequency of the reception signal is prevented from being inputted into the high frequency amplification circuit, which amplifies the high frequency signal from the branching filter, thus improving a signal to noise ratio in reception.

A radio communication device according to the present disclosure is characterized in the following configuration. The radio communication device includes the above-described high frequency front-end circuit; an antenna connected to the common terminal; and a radio frequency integrated circuit (RFIC) having a transmission circuit connected to the high frequency power amplifier, and a reception circuit connected to the high frequency amplification circuit for amplifying the high frequency signal from the branching filter.

According to this configuration, the use of the high frequency front-end circuit having the above configuration enables to realize the radio communication device having a favorable signal to noise ratio in reception.

According to the present disclosure, it is possible to realize a multimode/multiband-corresponding high frequency power amplifier that can amplify a transmission signal to be amplified to a desired level, while reducing the output level of a reception frequency component of the transmission signal.

DETAILED DESCRIPTION

Figure 1:
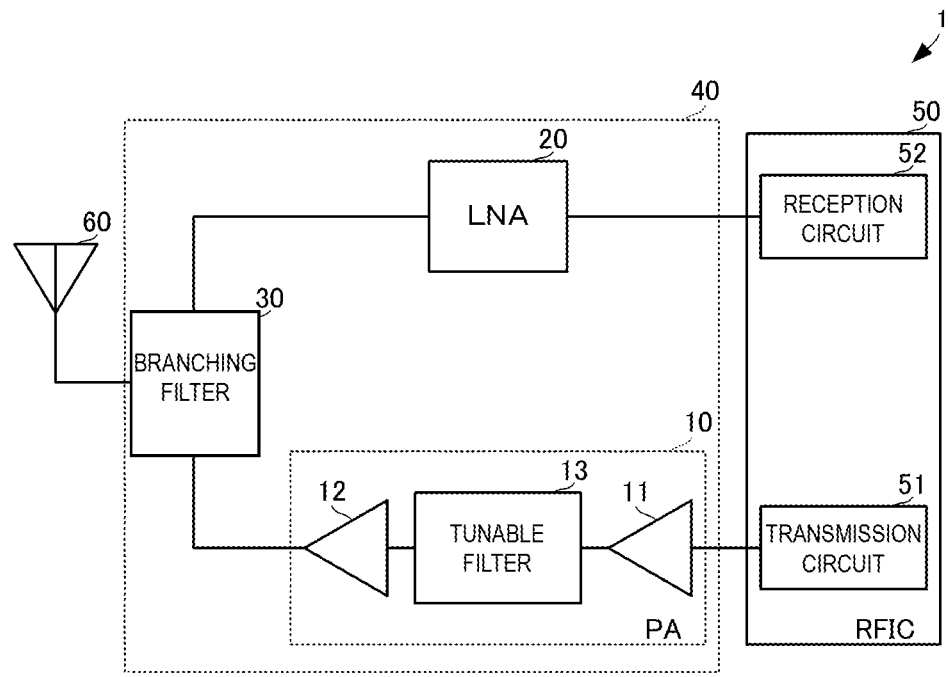
FIG. 1 is a circuit block diagram of a radio communication device according to a first embodiment of the present disclosure.

A high frequency power amplifier according to a first embodiment of the present disclosure, and a high frequency front-end circuit and a radio communication device including the high frequency power amplifier will be described with reference to the drawings. FIG. 1 is a circuit block diagram of the radio communication device according to the first embodiment of the present disclosure.

A radio communication device 1 includes a high frequency front-end circuit 40, a radio frequency integrated circuit (RFIC) 50, and an antenna 60.

The RFIC 50 includes a transmission circuit 51 and a reception circuit 52. The transmission circuit 51 generates a transmission signal in a communication band to be used in wireless communication. The reception circuit 52 demodulates a reception signal in the communication band. The RFIC 50, which has a multimode/multiband communication-corresponding circuit configuration, generates transmission signals and demodulates reception signals in a plurality of communication bands using different frequency bands in an individual manner.

The high frequency front-end circuit 40 includes a high frequency power amplifier 10, a low noise amplifier (LNA) 20, and a branching filter 30.

An input terminal of the high frequency power amplifier 10 is connected to an output terminal of the transmission circuit 51. An output terminal of the high frequency power amplifier 10 is connected to a first individual terminal of the branching filter 30. The high frequency power amplifier 10 amplifies the transmission signal inputted from the transmission circuit 51 by a desired amplification factor, and outputs the amplified transmission signal to the first individual terminal. The high frequency power amplifier 10 is a so-called multimode/multiband power amplifier that can amplify the transmission signal in a wide frequency band to a desired level.

The branching filter 30 outputs the high frequency signal inputted from the first individual terminal to a common terminal, and outputs a high frequency signal inputted from the common terminal to a second individual terminal. To the common terminal of the branching filter 30, the antenna 60 is connected. The LNA 20 is connected to the second individual terminal of the branching filter 30. Thus, the branching filter 30 transmits the transmission signal outputted from the high frequency power amplifier 10 to the antenna 60, and transmits the reception signal received by the antenna 60 to the LNA 20.

The LNA 20 is a so-called low noise amplifier, which amplifies the reception signal and outputs the amplified reception signal to the reception circuit 52.

In the radio communication device 1 and the high frequency front-end circuit 40 having such a circuit configuration, the high frequency power amplifier 10 has the following specific configuration.

The high frequency power amplifier 10 includes a first high frequency amplifier 11, a final high frequency amplifier 12, and a tunable filter 13. An input terminal of the first high frequency amplifier 11 is connected to an output terminal of the transmission circuit 51. An output terminal of the first high frequency amplifier 11 is connected to an input terminal of the final high frequency amplifier 12 through the tunable filter 13. An output terminal of the final high frequency amplifier 12 is connected to the first individual terminal of the branching filter 30.

The first high frequency amplifier 11 and the final high frequency amplifier 12 are each a high frequency amplifier in which a desired gain is obtained in a wide frequency band.

Figure 2:
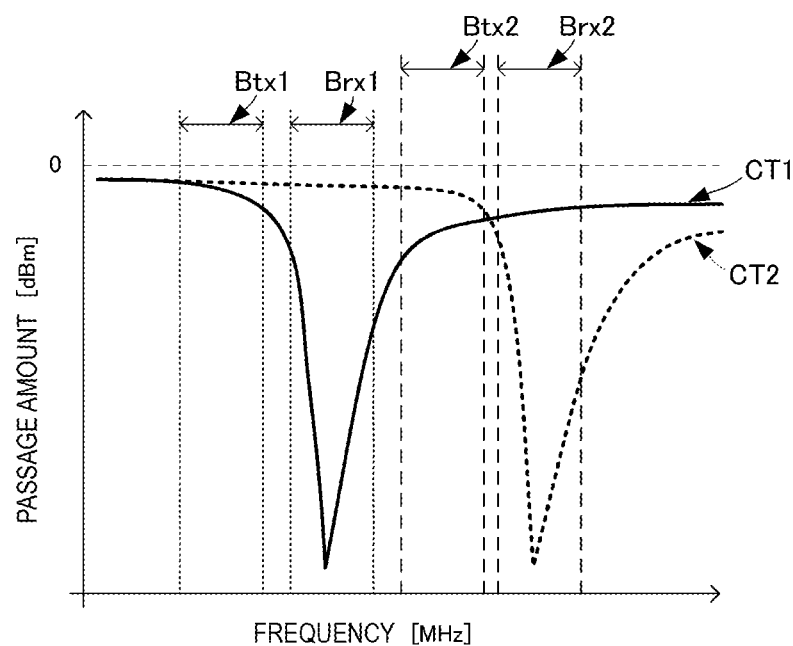
FIG. 2 is a graph showing the transmission frequency characteristics of a tunable filter according to an embodiment.

The tunable filter 13 is a filter in which a pass band and an attenuation band are adjustable. The tunable filter 13 may be any of a notch filter, a band pass filter (BPF), a band elimination filter (BEF), a low pass filter (LPF), and a high pass filter (HPF). In this embodiment, the notch filter is used as the tunable filter 13. FIG. 2 is a graph showing the transmission frequency characteristics of the tunable filter according to this embodiment. In FIG. 2, a horizontal axis represents a frequency, and a vertical axis represents a passage amount.

As shown by a solid line CT1 in FIG. 2, the circuit element values of the tunable filter 13 are set such that a frequency band Btx1 of a first transmission signal is within the pass band, while a frequency band Brx1 of a first reception signal is within the attenuation band in a first control mode using a first communication band. In a second control mode (different mode from the first control mode) using a second communication band, the tunable filter 13 is set such that, as shown by a dotted line CT2 in FIG. 2, a frequency band Btx2 of a second transmission signal is within the pass band, while a frequency band Brx2 of a second reception signal is within the attenuation band. In this embodiment, the frequency band of the reception signal contained in the transmission signal corresponds to "a specific frequency band" of the present disclosure. At this time, the entire frequency band of the reception signal does not always correspond to the specific frequency band, but a part of the frequency band of the reception signal may correspond to the specific frequency band.

In the tunable filter 13, the first control mode is selected when radio communication is carried out using the first communication band. In the tunable filter 13, the second control mode is selected when radio communication is carried out using the second communication band.

Figure 3:
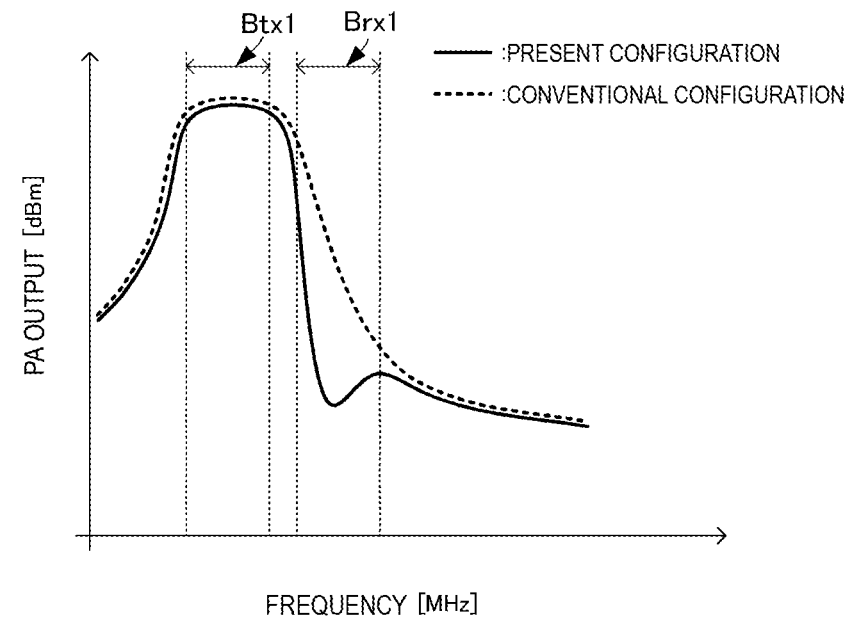
FIG. 3 is graphs showing the output characteristics of a high frequency power amplifier according to the first embodiment of the present disclosure.
Figure 3:
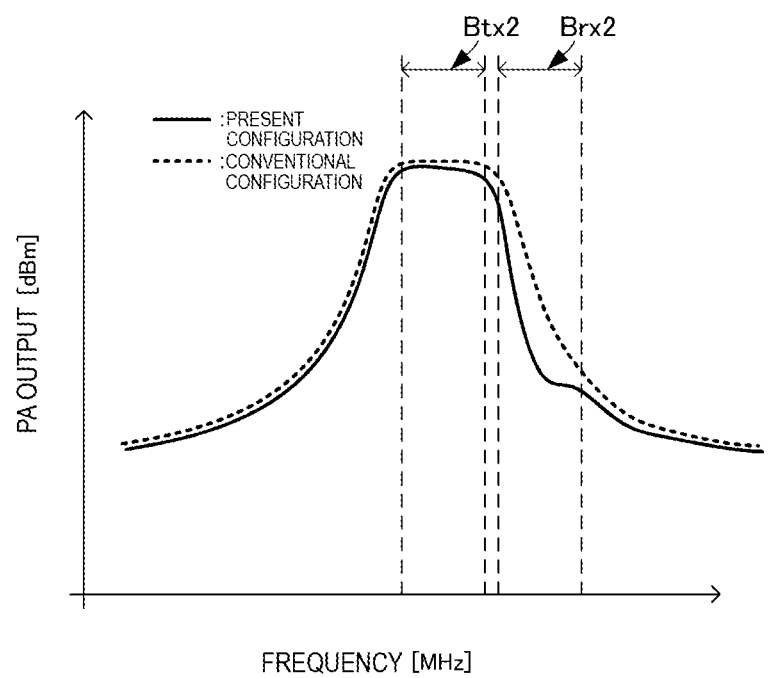

The high frequency power amplifier 10 having this configuration operates as described below. FIG. 3 is graphs showing the output characteristics of the high frequency power amplifier according to the first embodiment of the present disclosure. In FIG. 3, horizontal axes represent a frequency, and vertical axes represent an output level. In FIG. 3, solid lines represent the case of the configuration of the present disclosure, and dotted lines represent the case of a conventional configuration.

(Transmission and Reception Using First Communication Band)

The transmission circuit 51 generates the first transmission signal, and outputs the first transmission signal to the high frequency power amplifier 10. The first high frequency amplifier 11 amplifies the first transmission signal and outputs the amplified first transmission signal. Since the first high frequency amplifier 11 is a wide band high frequency amplifier corresponding to at least two or more communication bands, the first high frequency amplifier 11 amplifies the first transmission signal not only at a frequency component in the predetermined frequency band Btx1 (transmission frequency band) but also at a frequency component in the predetermined frequency band Brx1 (reception frequency band). The first transmission signal the signal level of which is amplified across the entire frequency band is inputted to the tunable filter 13.

In the first control mode, as described above, the tunable filter 13 is set so as to provide little attenuation in the frequency band Btx1 (transmission frequency band) but provide significant attenuation in the frequency band Brx1 (reception frequency band). Thus, the first transmission signal outputted from the tunable filter 13 has been hardly attenuated at the frequency component in the frequency band Btx1 (transmission frequency band) but significantly attenuated at the frequency component in the frequency band Brx1 (reception frequency band).

The first transmission signal outputted from the tunable filter 13 is amplified by the final high frequency amplifier 12 and outputted therefrom. At this time, the first transmission signal inputted to the final high frequency amplifier 12 has a high signal level at the frequency component in the frequency band Btx1 (transmission frequency band) and a low signal level at the frequency component in the frequency band Brx1 (reception frequency band).

Therefore, the first transmission signal outputted from the high frequency power amplifier 10 after being amplified by the final high frequency amplifier 12 is a high frequency signal that has, as shown in the upper graph in FIG. 3, a high signal level at a frequency component in the frequency band Btx1 (transmission frequency band) and a low signal level at a frequency component in the frequency band Brx1 (reception frequency band).

Accordingly, even if the first transmission signal leaks from the first individual terminal into the second individual terminal of the branching filter 30, the first transmission signal has the low signal level at the frequency component in the frequency band Brx1 (reception frequency band), thus preventing the deterioration of a signal to noise ratio of the reception signal.

(Transmission and Reception Using Second Communication Band)

The transmission circuit 51 generates the second transmission signal, and outputs the second transmission signal to the high frequency power amplifier 10. The first high frequency amplifier 11 amplifies the second transmission signal and outputs the amplified second transmission signal. Since the first high frequency amplifier 11 is a wide band corresponding high frequency amplifier, the first high frequency amplifier 11 amplifies the second transmission signal not only at a frequency component in the frequency band Btx2 (transmission frequency band) but also at a frequency component in the frequency band Brx2 (reception frequency band). The second transmission signal, of which the signal level is amplified across the entire frequency band, is inputted to the tunable filter 13.

In the second control mode, as described above, the tunable filter 13 is set so as to provide little attenuation in the frequency band Btx2 (transmission frequency band) and provide significant attenuation in the frequency band Brx2 (reception frequency band). Thus, the second transmission signal outputted from the tunable filter 13 is hardly attenuated at a frequency component in the frequency band Btx2 (transmission frequency band) but significantly attenuated at a frequency component in the frequency band Brx2 (reception frequency band).

The second transmission signal outputted from the tunable filter 13 is amplified by the final high frequency amplifier 12 and outputted therefrom. At this time, the second transmission signal inputted to the final high frequency amplifier 12 has a high signal level at the frequency component in the frequency band Btx2 (transmission frequency band) and a low signal level at the frequency component in the frequency band Brx2 (reception frequency band).

Therefore, the second transmission signal outputted from the high frequency power amplifier 10 after being amplified by the final high frequency amplified 12 is a high frequency signal that has, as shown in the lower graph in FIG. 3, a high signal level at a frequency component in the frequency band Btx2 (transmission frequency band) and a low signal level at a frequency component in the frequency band Brx2 (reception frequency band).

Accordingly, even if the second transmission signal leaks from the first individual terminal into the second individual terminal of the branching filter 30, the second transmission signal has the low signal level at the frequency component in the frequency band Brx2 (reception frequency band), thus preventing the deterioration of a signal to noise ratio of the reception signal.

The use of the configuration of this embodiment, as described above, makes it possible to reduce the component of the transmission signal to be amplified at the predetermined frequency of the reception signal, in the multimode/multiband high frequency power amplifier, which can amplify the transmission signals in a plurality of communication bands.

Therefore, in the high frequency front-end circuit including the high frequency power amplifier, it is possible to reduce the component of the transmission signal at the predetermined frequency of the reception signal, thus preventing the deterioration of a signal to noise ratio of the reception signal in a receiver side circuit.

The use of the configuration of this embodiment also makes it possible to reduce the component of the transmission signal generated by the RFIC 50 at the predetermined frequency of the reception signal. Thus, the reception signal is further reliably demodulated, and the radio communication device having superior communication characteristics is realized.

Figure 4:
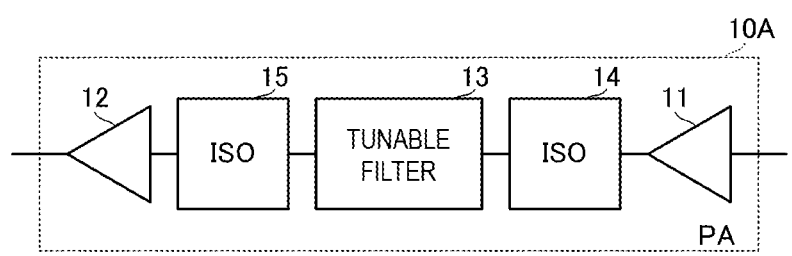
FIG. 4 is a circuit block diagram of a high frequency power amplifier according to a second embodiment of the present disclosure.

Next, a high frequency power amplifier according to a second embodiment of the present disclosure will be described with reference to the drawings. FIG. 4 is a circuit block diagram of the high frequency power amplifier according to the second embodiment of the present disclosure.

In a high frequency power amplifier 10A according to this embodiment, first and second isolators 14 and 15 are added to the high frequency power amplifier 10 of the first embodiment. The other configurations of the high frequency power amplifier 10A are the same as those of the high frequency power amplifier 10 according to the first embodiment. The configurations of a high frequency front-end circuit and a radio communication device, except for the high frequency power amplifier 10A, are the same as those of the first embodiment. Thus, differences from the high frequency power amplifier 10 will be concretely described.

The high frequency power amplifier 10A includes the first high frequency amplifier 11, the final high frequency amplifier 12, the tunable filter 13, and the first and second isolators 14 and 15.

The first isolator 14 is connected between the first high frequency amplifier 11 and the tunable filter 13. The second isolator 15 is connected between the tunable filter 13 and the final high frequency amplifier 12.

According to this configuration, even if the tunable filter 13 is regulated to change its filter characteristics, neither an impedance viewing a subsequent stage from the output terminal of the first high frequency amplifier 11, nor an impedance viewing a preceding stage from the input terminal of the final high frequency amplifier 12 changes. Therefore, there is no impedance mismatching caused by changing the filter characteristics of the tunable filter 13, thus preventing the occurrence of a transmission loss caused by the impedance mismatching.

It is noted that the addition of the first and second isolators 14 and 15 causes a loss irrespective of the communication band, but prevents the occurrence of impedance mismatching, which differs from one communication band to another. Thus, increasing an amplification factor of the first high frequency amplifier 11 or increasing an amplification factor of the final high frequency amplifier 12 facilitates outputting the desired signal level of the transmission signal from the high frequency power amplifier 10A. At this time, the provision of the tunable filter 13 serves to reduce the component of the transmission signal at the frequency of the reception signal, as described above.

Note that, in this embodiment, the isolators 14 and 15 are disposed in the preceding and subsequent stages of the tunable filter 13, respectively. However, as necessary, an isolator may be disposed in one of the preceding and subsequent stages of the tunable filter 13.

Figure 5:
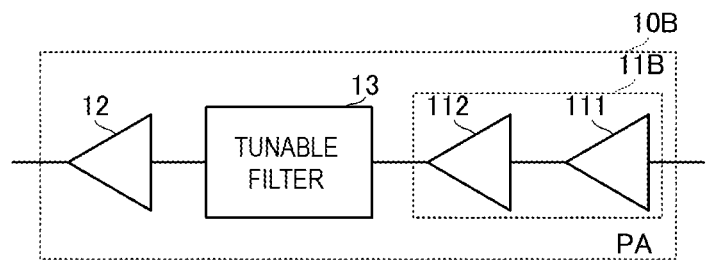
FIG. 5 is a circuit block diagram of a high frequency power amplifier according to a third embodiment of the present disclosure.

Next, a high frequency power amplifier according to a third embodiment of the present disclosure will be described with reference to the drawings. FIG. 5 is a circuit block diagram of the high frequency power amplifier according to the third embodiment of the present disclosure.

A high frequency power amplifier 10B according to this embodiment is different from the high frequency power amplifier 10 of the first embodiment as to the configuration of a first high frequency amplifier 11B, but is the same as to the other configurations. The configurations of a high frequency front-end circuit and a radio communication device, except for the high frequency power amplifier 10B, are the same as those of the first embodiment. Thus, differences from the high frequency power amplifier 10 will be concretely described.

The first high frequency amplifier 11B is constituted of a plurality of unit amplifiers 111 and 112 connected in series. More specifically, an input terminal of the unit amplifier 111 corresponds to an input terminal of the first high frequency amplifier 11B and the high frequency power amplifier 10B, and an output terminal of the unit amplifier 111 is connected to an input terminal of the unit amplifier 112. An output terminal of the unit amplifier 112 corresponds to an output terminal of the first high frequency amplifier 11B, and is connected to the tunable filter 13.

This configuration serves to obtain the same effects as those of the first embodiment. Note that, the tunable filter 13 may be connected between the plurality of unit amplifiers 111 and 112 constituting the first high frequency amplifier 11B. However, the tunable filter 13 can be connected between the first high frequency amplifier 11B and the final high frequency amplifier 12. In other words, the tunable filter 13 can be disposed as close to the output terminal of the first high frequency amplifier 11B as possible, and at the preceding stage side of the final high frequency amplifier 12.

The plurality of unit amplifiers are connected in series in this embodiment. However, unit amplifiers having settings in accordance with each communication band may be prepared and connected in parallel in a switchable manner with a switch or the like may be connected to the tunable filter 13.

Figure 6:
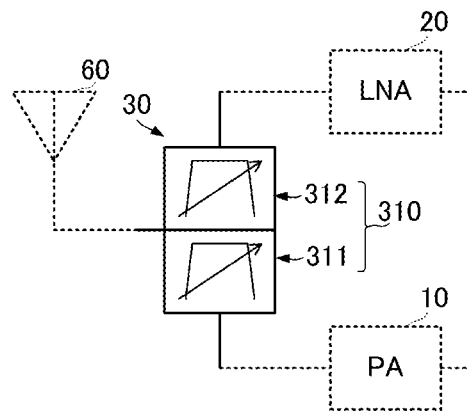
FIGS. 6A-6C are circuit block diagrams showing examples of various circuit configurations of a branching filter according to embodiments of the present disclosure.
Figure 6:
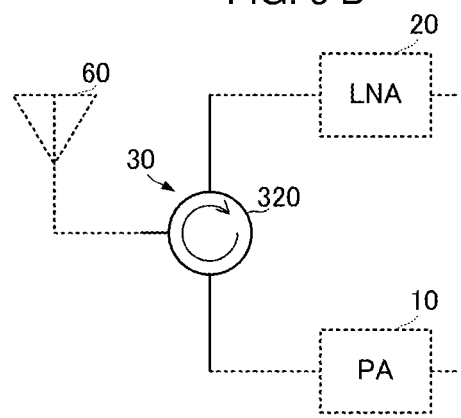
Figure 6:
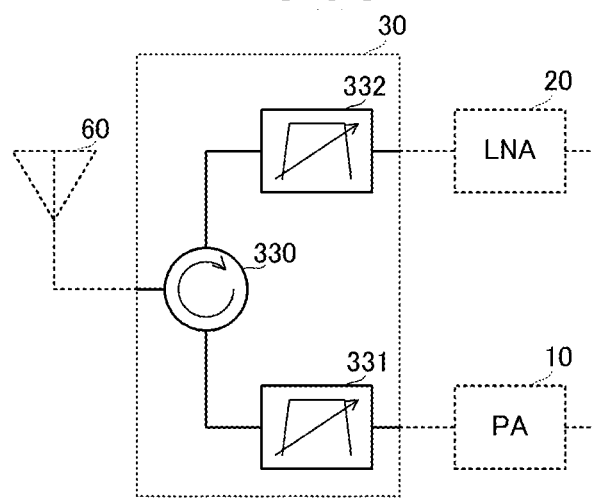

The concrete circuit configuration of the branching filter 30 is not shown in each of the above embodiments, but the branching filter 30 may have, for example, any of a plurality of circuit configurations described below. FIGS. 6A-6C are circuit block diagrams showing examples of various circuit configurations of the branching filter according to embodiments of the present disclosure.

The branching filter 30 shown in FIG. 6A is constituted of a frequency variable duplexer 310. The duplexer 310 includes frequency variable filters 311 and 312. The frequency variable filter 311 is disposed between the first individual terminal and the common terminal. The frequency variable filter 311 passes the frequency band of the transmission signal and attenuates the other frequency bands. The frequency variable filter 312 is disposed between the common terminal and the second individual terminal. The frequency variable filter 312 passes the frequency band of the reception signal and attenuates the other frequency bands. The pass and attenuation bands of the frequency variable filters 311 and 312 are adjustable.

The branching filter 30 shown in FIG. 6B is constituted of a circulator 320. The circulator 320 includes a first terminal, a second terminal, and a third terminal. The circulator 320 has a configuration so as to output a high frequency signal inputted from the first terminal to the third terminal, output a high frequency signal inputted from the third terminal to the second terminal, and output a high frequency signal inputted from the second terminal to the first terminal. The first terminal corresponds to a first individual terminal of the present disclosure. The second terminal corresponds to a second individual terminal of the present disclosure. The third terminal corresponds to a common terminal of the present disclosure.

The transmission signal outputted from the high frequency power amplifier 10 is inputted to the first terminal of the circulator 320, and outputted to the common terminal. The reception signal inputted from the common terminal of the circulator 320 is outputted to the second individual terminal (LNA 10).

The branching filter 30 shown in FIG. 6C includes a circulator 330 and frequency variable filters 331 and 332.

The circulator 330 includes a first terminal, a second terminal, and a third terminal. The circulator 330 has a configuration so as to output a high frequency signal inputted from the first terminal to the third terminal, output a high frequency signal inputted from the third terminal to the second terminal, and output a high frequency signal inputted from the second terminal to the first terminal. The first terminal of the circulator 330 is connected to the high frequency power amplifier 10 through the frequency variable filter 331. The second terminal of the circulator 330 is connected to the LNA 20 through the frequency variable filter 332.

The frequency variable filter 331 passes the frequency band of the transmission signal and attenuates the other frequency bands. The frequency variable filter 332 passes the frequency band of the reception signal and attenuates the other frequency bands. The pass and attenuation bands of the frequency variable filters 331 and 332 are adjustable.

Next, a high frequency front-end circuit and a radio communication device according to a fourth embodiment of the present disclosure will be described with reference to the drawings.

Figure 7:
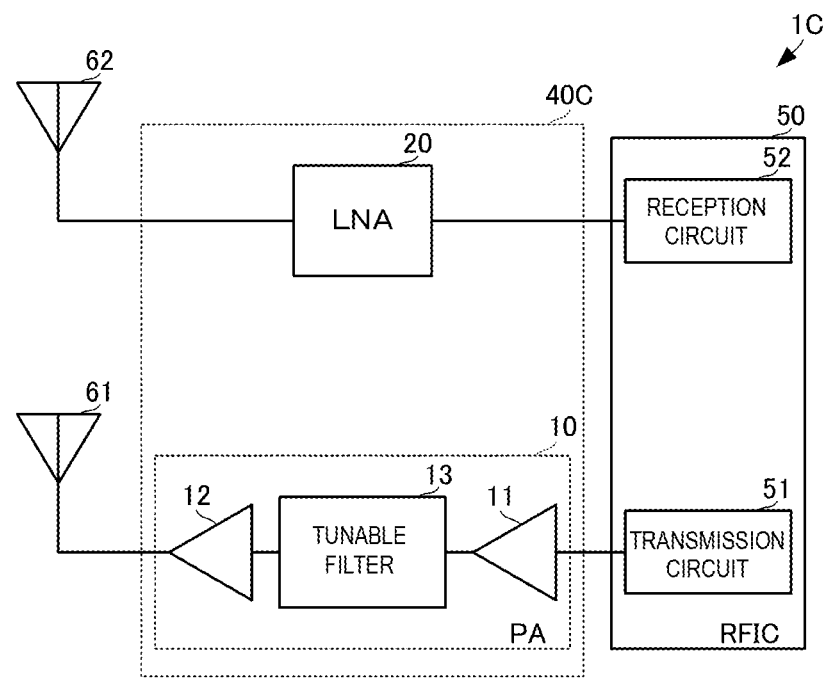
FIG. 7 is a circuit block diagram of a radio communication device according to a fourth embodiment of the present disclosure.

The branching filter 30 is used in each of the above embodiments. However, in this embodiment, a transmission antenna and a reception antenna are individually used without necessarily using the branching filter 30. FIG. 7 is a circuit block diagram of the radio communication device according to the fourth embodiment of the present disclosure.

As shown in FIG. 7, a radio communication device 1C includes a high frequency front-end circuit 40C, the RFIC 50, a transmission antenna 61, and a reception antenna 62.

The high frequency front-end circuit 40C includes the high frequency power amplifier 10 and the LNA 20. The input terminal of the high frequency power amplifier 10 is connected to the transmission circuit 51 of the RFIC 50, and the output terminal of the high frequency power amplifier 10 is connected to the transmission antenna 61. The input terminal of the LNA 20 is connected to the reception antenna 62, and the output terminal of the LNA 20 is connected to the reception circuit 52 of the RFIC 50.

Even in such a configuration, if the radio communication device 1C is miniaturized in size, not a little electromagnetic field coupling occurs owing to the interference between the transmission antenna 61 and the reception antenna 62. Accordingly, the reception antenna 62 receives the component of the transmission signal emitted from the transmission antenna 61 at the frequency of the reception signal. However, the use of the high frequency power amplifier 10 serves to reduce the component of the transmission signal at the frequency of the reception signal, as described in each of the above embodiments, so that it is possible to improve a signal to noise ratio of the reception signal, as compared with that in a conventional configuration.

Figure 8:
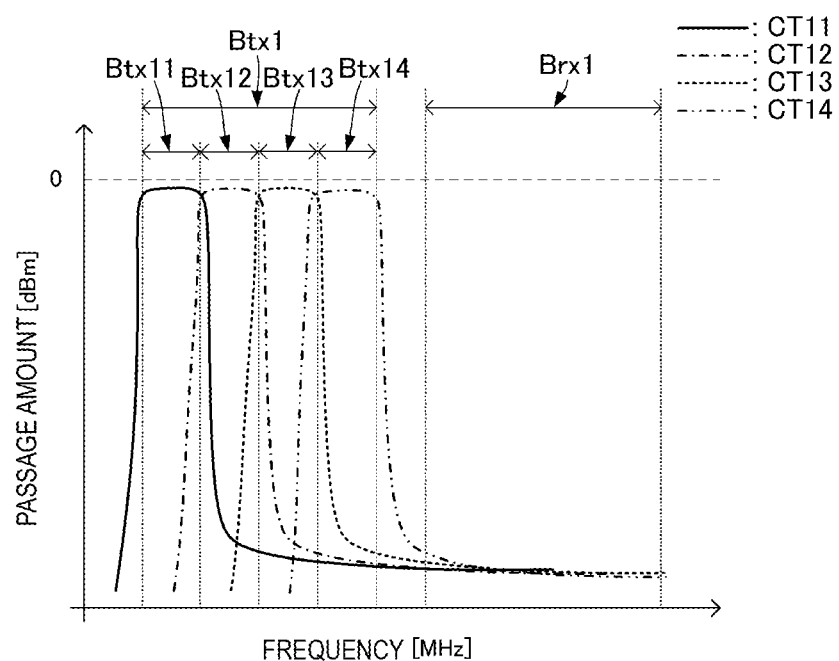
FIG. 8 is a graph showing the transmission frequency characteristics of another aspect of the tunable filter according to an embodiment of the present disclosure.

It is noted that the tunable filter connected between the high frequency amplifiers may be configured so as to have the following characteristics, instead of the characteristics described in each of the above embodiments. FIG. 8 is a graph showing the transmission frequency characteristics of another aspect of the tunable filter according to an embodiment of the present disclosure.

The actual transmission of a high frequency signal is not necessarily performed using the entire frequency width of the transmission frequency band allocated in the communication band. For example, the transmission may be performed with a channel band width (frequency band width) selected from 1.4 MHz, 3 MHz, 5 MHz, 10 MHz, 15 MHz, and 20 MHz, which are channel band widths (frequency band widths) corresponding to the band widths of transmission modulation bands adhering to the 3GPP (third generation partnership project) standards. In this case, the selected transmission modulation band corresponds to a useful frequency band. For example, as shown in FIG. 8, the transmission frequency band Btx1 may include four useful frequency bands Btx11, Btx12, Btx13, and Btx14. The radio communication device chooses any of the useful frequency bands Btx11, Btx12, Btx13, and Btx14. The radio communication device generates a transmission signal having a frequency corresponding to the chosen one of the useful frequency bands Btx11, Btx12, Btx13, and Btx14, and transmits the transmission signal.

As shown in FIG. 8, the tunable filter is configured so as to realize the filter characteristics corresponding to the useful frequency bands Btx11, Btx12, Btx13, and Btx14. To be more specific, when the useful frequency band Btx11 is chosen, as shown by a solid line CT11 in FIG. 8, the tunable filter is configured as a band-pass filter that passes the useful frequency band Btx11 and attenuates the other frequency bands. When the useful frequency band Btx12 is chosen, as shown by an alternate long and short dashed line CT12 in FIG. 8, the tunable filter is configured as a band-pass filter that passes the useful frequency band Btx12 and attenuates the other frequency bands. When the useful frequency band Btx13 is chosen, as shown by a dotted line CT13 in FIG. 8, the tunable filter is configured as a band-pass filter that passes the useful frequency band Btx13 and attenuates the other frequency bands. When the useful frequency band Btx14 is chosen, as shown by a dotted line CT14 in FIG. 8, the tunable filter is configured as a band-pass filter that passes the useful frequency band Btx14 and attenuates the other frequency bands.

As described above, narrowing the frequency band width to be passed allows improved bandpass characteristics of the tunable filter and improved attenuation effect of the reception frequency component.

REFERENCE SIGNS LIST 1, 1C RADIO COMMUNICATION DEVICE
10, 10A, 10B HIGH FREQUENCY POWER AMPLIFIER
11, 11B FIRST HIGH FREQUENCY AMPLIFIER
12 FINAL HIGH FREQUENCY AMPLIFIER
13 TUNABLE FILTER
14 FIRST ISOLATOR

15 SECOND ISOLATOR
20 LNA
30 BRANCHING FILTER
40, 40C HIGH FREQUENCY FRONT-END CIRCUIT
50 RFIC
51 TRANSMISSION CIRCUIT
52 RECEPTION CIRCUIT
60 ANTENNA
111, 112 UNIT AMPLIFIER
310 DUPLEXER
311, 312, 331, 332 FREQUENCY VARIABLE FILTER
320, 330 CIRCULATOR

The invention claimed is:

1. A high frequency power amplifier comprising:
a first high frequency amplifier having a gain in a wide band;
a final high frequency amplifier connected subsequent to the first high frequency amplifier, the final high frequency amplifier having a gain in a wide band;
a tunable filter connected between the first high frequency amplifier and the final high frequency amplifier, the tunable filter providing a predetermined attenuation in a specific frequency band other than a frequency band to be amplified; and
an isolator connected between the first high frequency amplifier and the tunable filter, and/or between the tunable filter and the final high frequency amplifier.

2. The high frequency power amplifier according to claim 1, wherein the frequency band to be amplified is a transmission modulation band selected within a transmission frequency band of a predetermined communication band.

3. The high frequency power amplifier according to claim 1, further comprising:
an isolator connected between the first high frequency amplifier and the tunable filter, and
an isolator connected between the tunable filter and the final high frequency amplifier.

4. The high frequency power amplifier according to claim 1, wherein
the first high frequency amplifier includes a plurality of unit amplifiers; and
the tunable filter is connected between the final high frequency amplifier and the unit amplifier connected to an input terminal of the final high frequency amplifier.

5. The high frequency power amplifier according to claim 4, wherein the plurality of unit amplifiers are associated with a plurality of communication bands and are connected in parallel in a switchable manner.

6. A high frequency front-end circuit comprising:
the high frequency power amplifier according to claim 1;
a branching filter that outputs a high frequency signal inputted from a first individual terminal to a common terminal and outputs a high frequency signal inputted from the common terminal to a second individual terminal, the high frequency power amplifier being connected to the first individual terminal; and
a high frequency amplification circuit connected to the second individual terminal and amplifying the high frequency signal from the branching filter, wherein
the frequency band to be amplified includes a frequency band of a transmission signal to be amplified by the high frequency power amplifier, and
the specific frequency band includes a frequency band of a reception signal to be amplified by the high frequency amplification circuit.

7. A radio communication device comprising:
the high frequency front-end circuit according to claim 6;
an antenna connected to the common terminal; and
a radio frequency integrated circuit (RFIC) having a transmission circuit connected to the high frequency power amplifier, and a reception circuit connected to the high frequency amplification circuit that amplifies the high frequency signal from the branching filter.

8. The high frequency front end circuit according to claim 6, wherein the branching filter comprises a first variable frequency filter disposed between the first individual terminal and the common terminal, and a second variable frequency filter disposed between the second individual terminal and the common terminal.

9. The high frequency front end circuit according to claim 8, wherein the first variable frequency filter passes the frequency band of the transmission signal, and the second variable frequency filter passes the frequency band of the reception signal.

10. The high frequency front end circuit according to claim 6, wherein the branching filter comprises a circulator.

11. The high frequency front end circuit according to claim 6, wherein the branching filter comprises:
a circulator having a first terminal, a second terminal, and a third terminal;
a first variable frequency filter disposed between the first individual terminal of the branching filter and the first terminal of the circulator; and
a second variable frequency filter disposed between the second individual terminal of the branching filter and the second terminal of the circulator,
wherein the third terminal of the circulator is connected to the common terminal of the branching filter.

12. The high frequency front end circuit according to claim 11, wherein the first variable frequency filter passes the frequency band of the transmission signal, and the second variable frequency filter passes the frequency band of the reception signal.

13. The high frequency front end circuit according to claim 6, wherein the high frequency amplification circuit comprises a low noise amplifier.

* * * * *